STRUCTURE AND FABRICATION OF MICROWAVE OSCILLATORS

Filed Nov. 23, 1966 Sheet 1 of 2

INVENTOR
David Dexter Martin

BY Jack A. Kanz
ATTORNEY

INVENTOR
David Dexter Martin

BY Jack A. Kanz
ATTORNEY

United States Patent Office 3,435,306

Patented Mar. 25, 1969

3,435,306

STRUCTURE AND FABRICATION OF MICROWAVE OSCILLATORS

David D. Martin, Dallas, Tex., assignor to Texas Instruments Incorporated, Dallas, Tex., a corporation of Delaware Filed Nov. 23, 1966, Ser. No. 596,485
Int. Cl. H011 3/00, 5/00
U.S. Cl. 317—237 4 Claims

ABSTRACT OF THE DISCLOSURE

Disclosed is a Gunn effect microwave oscillator comprising a block of high-resistivity gallium arsenide having an epitaxial layer of N-type gallium arsenide formed on one surface thereof, and a cavity formed through the block to contact the gallium arsenide layer. Two ohmic contacts are formed to the device one at the base of the cavity to the gallium arsenide layer and the other to the outside, or opposite side of the gallium arsenide layer. A thermally and electrically conducting material is formed in the cavity, and electrodes are connected to the thermally conducting material and to the outside ohmic electrode.

This invention relates to semiconductor devices, and more particularly to the fabrication and structure of gallium arsenide microwave oscillators. These devices are referred to as Gunn effect oscillators which are described in Patent No. 3,262,059 issued to J. B. Gunn et al. on July 19, 1966, but have also been observed to operate in a mode other than that described by J. B. Gunn. See J. A. Copeland, Effect of External Circuitry on Gunn Diodes, Electron Device Research Conference, California Institute of Technology, June 29, 1966.

A Gunn effect oscillator is a solid state source of microwave radiation consisting of a tiny crystal of gallium arsenide which can be used as a source of microwave current oscillations by applying a voltage across it. One device configuration known in the art is a thin layer of N doped high resistivity, e.g. 1 ohm-cm., gallium arsenide (GaAs) sandwiched between a pair of ohmic contacts with leads attached thereto. Another configuration, similar to the one mentioned above, has an additional layer of N+ doped GaAs serving as a substrate for an epitaxial layer of N doped high resistivity GaAs with one ohmic contact attached to the surface of the N+ material and the other ohmic contact attached to the surface of the N doped material.

Three problems related to these and other configurations require solution in order to make the Gunn oscillator a more effective device. The first problem is "surface breakdown," which is a phenomenon associated with high electric field surrounding the oscillating crystal. Surface breakdown occurs when surface traps due to impurities or imperfections existing near the surface of the N-type GaAs layer are impact-ionized by electrons energized by the high electrical field, and produce a surface short circuit. Consequently the electrical characteristics of a Gunn oscillator will not depend solely on its design parameters, but also on the type and distribution of surface contamination and imperfections.

The second problem is the heat produced in the N-type GaAs layer during operation. Excessive temperature in the device severely limits its power handling capabilities, and if the temperature becomes excessive and the heat is not properly dissipated, power runaway follows, resulting in device failure.

The third problem is obtaining very thin slices of GaAs and preserving them intact throughout the manufacturing process. For use at very high frequencies, the N-type GaAs slice must be very thin on the order of about three microns to one hundred microns or more; for example, at 30 gHz. the slice must be approximately 5 microns thick. Once thin slices are obtained, subsequent handling may result in breakage due to the brittleness of GaAs. An attempt to scribe several N-type GaAs slices from a single thin wafer of N doped GaAs can result in a relatively low yield. However, in order that oscillators be produced efficiently and inexpensively, it is necessary that many slices be derived from a single wafer.

Accordingly, it is an object of this invention to provide a gallium arsenide microwave oscillator resistant to surface breakdown by using a novel design wherein the strength of the electrical field surrounding the oscillating crystal is reduced.

It is another object of the invention to provide a gallium arsenide microwave oscillator of novel design with thermal dissipation characteristics which allow reliable device operation and increased power handling capabilities;

It is yet another object of the invention to provide a gallium arsenide microwave oscillator of novel design in which thin layer of N-type GaAs may be accurately fabricated;

It is yet a further object of the invention to provide a gallium arsenide microwave oscillator of novel design which may be produced efficiently and inexpensively;

It is still a further object of the invention to provide a method for producing gallium arsenide microwave oscillators in which thin N doped GaAs layers may be handled with ease.

The invention, together with further objects and advantages thereof, will best be understood by reference to the following detailed description when read in conjunction with the accompanying drawings, its scope being defined by the appended claims.

In the drawings, which are not to scale, certain dimensions have been exaggerated for purposes of illustration;

FIGURE 7 is a pictorial view in section of a microwave oscillator fabricated from monocrystalline N-type GaAs in bulk form; while FIGURES 8 through 12 are views of the microwave oscillator pictured in FIGURE 7 at various stages of fabrication.

Figures 1, 2, 3, 4, 5, 6:
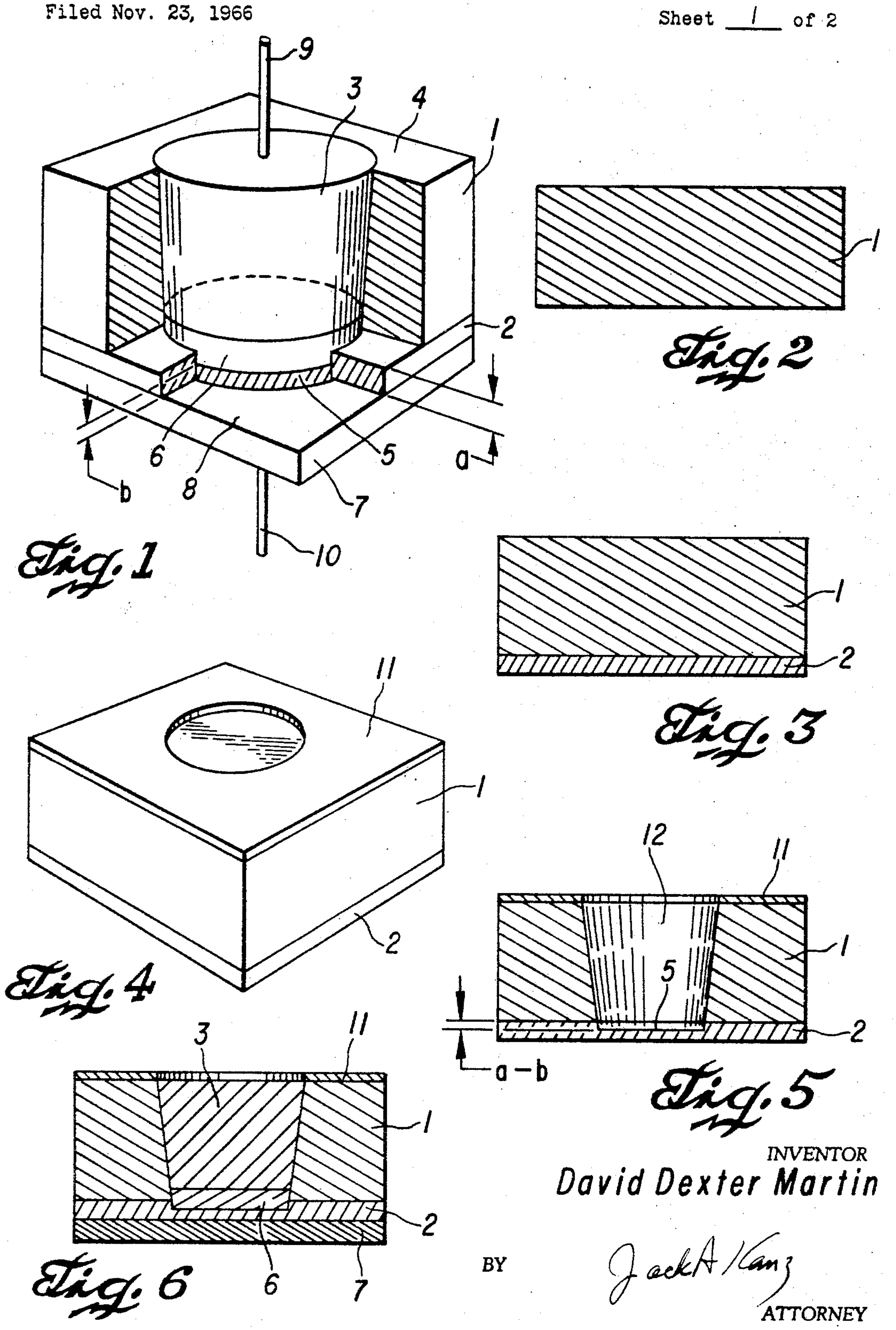
FIGURE 1 is a pictorial view in section of a microwave oscillator devised from a semi-insulating GaAs substrate on which an epitaxial layer of N-type GaAs has been grown.
FIGURES 2 through 6 are views of the microwave oscillator shown in FIGURE 1 at various stages of the fabrication.

Referring to FIGURE 1, a substrate body of semi-insulating monocrystalline GaAs 1 is pictured ($p$ being on the order of $10^5$ ohm-cm. or greater), on one surface of which a layer 2 of monocrystalline N-type high resistivity GaAs has been epitaxially grown. The thickness of the epitaxial layer, indicated by $a$, is slightly greater than that required for the desired characteristics of the device. A hole filled by stud 3 extends from the free surface 4 of the semi-insulating substrate body 1, through the substrate body 1 and into the epitaxial layer 2, creating a surface 5 within the epitaxial layer 2. This hole is preferably circular, as shown, but other geometries may be employed. The depth of the hole is controlled by etching or other suitable means for forming the hole, and the thickness of the section at the epitaxial layer below surface 5, indicated by $b$, is precisely the thickness required for the desired characteristics of the device, noting that the frequency is inversely proportional to the thickness $b$. See J. B. Gunn, "Instabilities of Current in III–V Semiconductors," vol. 8 pp. 141–159 (1964), IBM Journal of Research. The area of surface 5 is likewise selected with ultimate device characteristics in mind, the larger the area the greater the current capacity of a device. An ohmic contact 6 comprised of a conducting material, such as a gold-tin alloy or a silver-germanium-indium alloy, is suitably affixed to the epitaxial layer 2 at surface 5 and extends above that surface into the hole of substrate 1. The remainder of the hole is filled with material of high thermal and electrical conductivity, a suitable example being gold, to form the stud 3. Alternately, the stud may be an extension of contact 6. Another ohmic contact 7 comprised of a conducting material is suitably affixed to the epitaxial layer 2 at surface 8. Leads 9 and 10 are attached to the stud 3 and ohmic contact 7, respectively, by any suitable method known in the art.

The active region, being that region in which the microwave current oscillations are produced, is the region in the epitaxial layer lying directly below and adjacent the surface 5. By confining the active region within a surface periphery which is relatively far from the edges of the epitaxial layer, the electric fields existing near the edges of the layer when current is applied to the device are very weak since the strength of the field is inversely proportional to the linear surface distance between the ohmic contacts. Consequently, the currents appearing near the surface of layer 2 are commensurately reduced since the electrons in the surface are not supplied with sufficient energy to impact-ionize the surface traps, and the problem of surface breakdown is substantially minimized if not entirely eliminated. Furthermore, fabrication of the device from a substrate body of semi-insulating GaAs, upon which N doped gallium arsenide is epitaxially deposited, eliminates the problem of handling fragile, thin wafers of GaAs and imparts physical strength to the device. The provision of the hole in substrate 1 offers a third advantage; the space represented by the hole may be readily filled with a highly thermal conductive material, gold for example, to form a low thermal resistance path or heat sink. The low thermal conductivity of gallium arsenide would place a limitation on the thermal dissipation capabilities of the device if no holes were formed over the contact 6 and filled with a highly thermal conductive substance.

Reference is now had to FIGURES 2 through 6, which are sectional views of the oscillator pictured in FIGURE 1 at various stages in its fabrication, and in which numerical identifications correspond to those in FIGURE 1.

FIGURE 2 illustrates a substrate body 1 of semi-insulating monocrystalline gallium arsenide (GaAs) which, in the preferred embodiment of the invention, is chromium doped GaAs having a resistivity on the order of $10^5$ ohm-cm. or greater. In FIGURE 3, a layer 2 of epitaxial N-type high resistivity GaAs has been grown on one surface of the substrate body. The resistivity of this N-type material is preferably, but not limited to, 1–10 ohm-cm. In FIGURE 4 the opposite surface of the substrate body has been masked with a layer 11 of insulating material, a suitable example being silicon dioxide, to define a circular pattern thereon. In FIGURE 5, a hole 12 has been etched through the substrate body and into the epitaxial layer 2 of N-type high resistivity gallium arsenide to a depth of *a–b* creating a surface 5 within the epitaxial layer 2.

In FIGURE 6, ohmic contacts 6 and 7 have been formed in the hole and upon the exposed surface of the epitaxial layer, respectively, by alloying in with appropriate means a layer of 50% gold-50% tin, by way of example, and the remainder of the hole filled with material 3 of high thermal and electrical conductivity, such as gold. The final step of attaching the leads 9 and 10 is not shown since they can be attached by well known methods in the art.

Figures 7, 8, 9, 10, 11, 12:
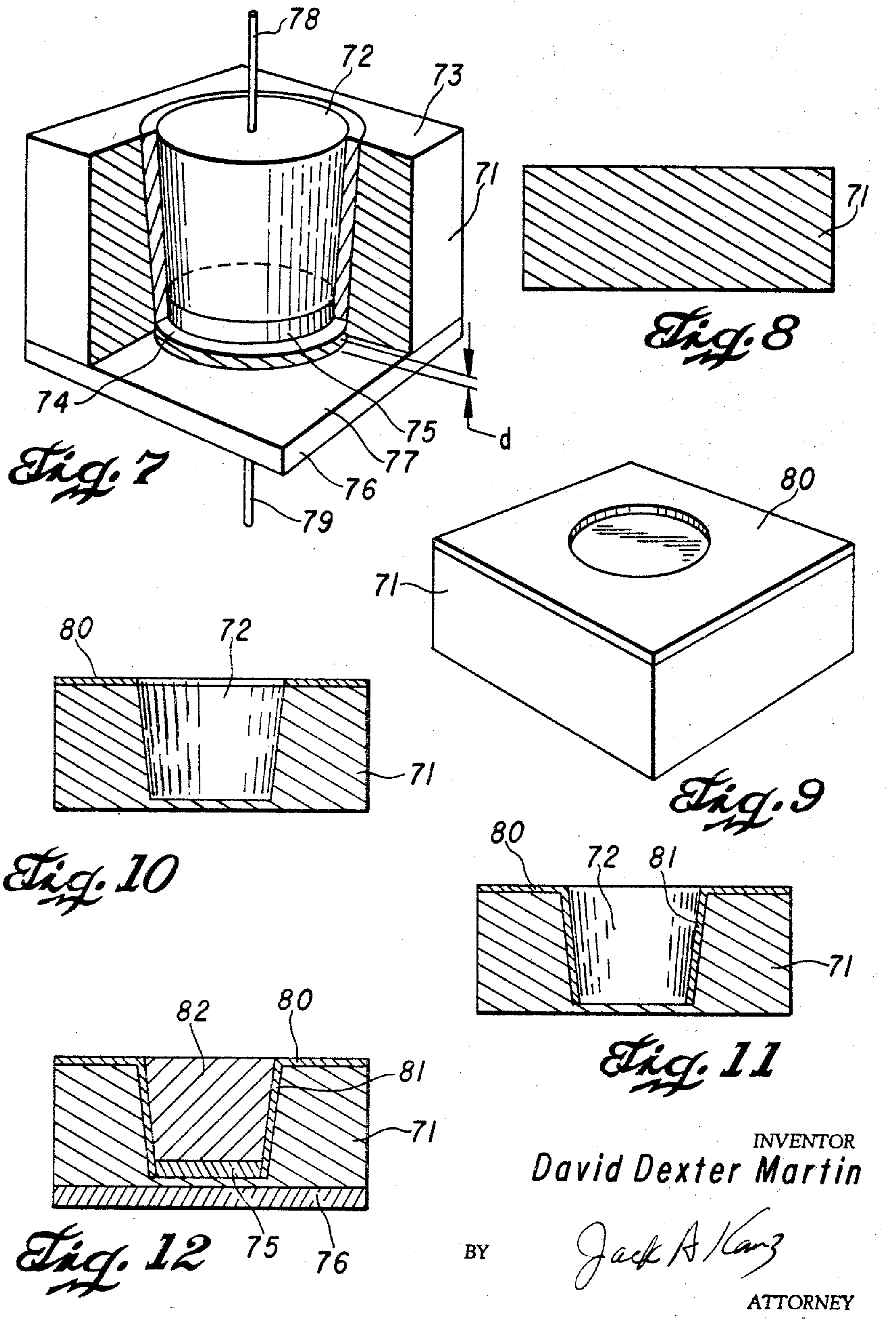

A modification of the device of the invention in which no epitaxial growth of N-type high resistivity GaAs is involved is illustrated in FIGURE 7, and the method of fabricating the device is indicated in FIGURES 8 through 12. Referring to FIGURE 7, in a substrate body of monocrystalline N-type high resistivity GaAs 71, a hole filled by stud 72 extends from the free surface 73 of the N-type GaAs 71, into the substrate body to surface 74. The depth of the hole is so controlled that the thickness of the section below surface 74, indicated by *d*, is precisely that required for the desired characteristics of the device. The area described by surface 74 is similarly controlled with ultimate characteristics in mind. After masking the walls of the hole with a suitable insulating material, an ohmic contact 75 is affixed to the surface 74. The remainder of the hole is filled with material of high thermal and electrical conductivity to form the stud 72. Another ohmic contact 76 is affixed to the substrate body at surface 77. Leads 78 and 79 are attached to the stud 72 and ohmic contact 77, respectively, by any suitable method known in the art.

The active region in the substrate body of N-type high resistivity GaAs is that region lying directly below surface 74. By confining the active region within a surface periphery which is relatively far from the edges of the substrate body, the electric fields existing near the edges of the substrate are very weak. Consequently, the currents appearing near the surface are commensurately reduced and the problem of surface breakdown is substantially minimized if not entirely eliminated. Fabrication of the device from a substrate body of monocrystalline N doped high resistivity GaAs, with subsequent etching thereof, eliminates the problem of handling fragile, thin wafers of GaAs and provides physical strength for the device. Another advantage is that the hole may be filled with a highly thermal conductive material to form a low thermal resistance path, or "heat sink," which rapidly dissipates heat from the device, permitting reliable operation and increased power handling capabilities.

The technique of producing the modified device of the invention is illustrated in FIGURES 8 through 12, which are sectional views of the microwave oscillator of the type pictured in FIGURE 7, at various stages in its fabrication. FIGURE 8 shows the substrate body 71 of monocrystalline N-type high resistivity GaAs which has a resistivity preferably, but not limited to 1–10 ohm-cm. In FIGURE 9 one surface of the substrate body has been masked with a layer 80 of a suitable mask material such as silicon dioxide to define a circular pattern thereon. In FIGURE 10 a hole 72 has been etched into the substrate body to a depth so that the thickness of the section directly below the hole is precisely that required for the desired characteristics of the device. In FIGURE 11 the walls of the hole have been mashed with a layer 81 of suitable mash material, and in FIGURE 12, ohmic contacts 75 and 76 have been formed in the hole and upon the exposed surface of the substrate body, respectively. The remainder of the hole has been filled with material 82 of high thermal and electrical conductivity, such as gold. The final step of attaching leads is not shown.

While the invention has been particularly shown and described with reference to preferred embodiments thereof, it is understood that various other changes and modifications thereof will occur to a person skilled in the art without departing from the spirit and scope of the invention as defined by the appended claims.

What is claimed is:

1. In a method of making a microwave oscillator, the steps of:

(a) epitaxially depositing a layer of N-type gallium arsenide upon a surface of a monocrystalline semi-insulating gallium arsenide substrate having an electrical resistivity of at least $10^4$ times the electrical resistivity of said layer, (b) etching a cavity from the opposite surface of said substrate through the substrate and into said epitaxial layer, the thickness of the portion of said epitaxial layer below said cavity being no more than a few microns thick, (c) applying ohmic electrodes to opposite sides of said epitaxial layer at the bottom of said cavity, and (d) filling said cavity with a heat conductive electrical conductor contacting the electrode on the bottom layer in said cavity and extending to the surface of said cavity.

2. In a method of making a microwave oscillator, the steps of:

(a) etching a cavity from one surface of a body of monocrystalline N-type gallium arsenide to within no more than a few microns of the opposite surface of said body, (b) coating the walls of said cavity and the surface on which said cavity opens with an insulating material, (c) applying ohmic electrodes to the opposite sides of the material no more than a few microns thin at the bottom, and (d) filling said cavity with a thermally conductive electrical connector, contacting the ohmic electrode at the bottom of said cavity.

3. A microwave oscillator comprising:

(a) a monocrystalline N-type gallium arsenide body having a resistance of between 1 to 10 ohm-cm., (b) said body having a cavity with an opening on one side of said body and with its bottom no more than a few microns from another side of said body, (c) an insulating film on the walls of said cavity and the side of said body at said opening, (d) ohmic electrodes on opposite sides of the bottom of said cavity, and (e) a heat conductive electrical connector in said cavity contacting the ohmic electrode on the bottom of said cavity and extending to the side of said body at said opening.

4. A microwave oscillator comprising:

(a) a monocrystalline gallium arsenide body including a substrate and a surface layer on one side of said substrate, with electrical resistivity of said substrate being at least $10^4$ times the electrical resistivity of the layer;

(b) said body having a cavity with its openings on a side opposite to said layer and a section of the layer no more than a few microns thick forming the bottom wall of said cavity;

(c) ohmic electrodes on opposite sides of said bottom wall, and (d) a heat conductive electrical connector in said cavity contacting the ohmic electrode on the bottom wall thereof and extending to the surface of said body at said opening.

References Cited

UNITED STATES PATENTS 3,032,695 5/1962 Zielasek ------------ 317—234

3,322,581 5/1967 Hendrickson et al. -- 317—234 X

JAMES D. KALLAM, *Primary Examiner.*

U.S. Cl. X.R.

29—580; 317—234